United States Patent [19]
Summerfelt et al.

[11] Patent Number: 5,504,330
[45] Date of Patent: Apr. 2, 1996

[54] LEAD SUBSTITURED PEROVSKITES FOR THIN-FILM PYROELECTRIC DEVICES

[75] Inventors: Scott R. Summerfelt, Dallas; Howard R. Beratan, Richardson, both of Tex.; Bernard Kulwicki, N. Attleboro, Mass.

[73] Assignee: Texas Instruments Incorporated, Dallas, Tex.

[21] Appl. No.: 343,269

[22] Filed: Nov. 22, 1994

[51] Int. Cl.$^6$ ................................................. G01J 5/20
[52] U.S. Cl. ................. 250/338.3; 250/332; 250/349
[58] Field of Search ........................... 250/332, 338.2, 250/338.3, 349

[56] References Cited

U.S. PATENT DOCUMENTS

| | | | |
|---|---|---|---|
| 3,410,705 | 11/1968 | Honma | 501/137 |
| 4,024,081 | 5/1977 | Ohmori et al. | 252/62.9 |
| 4,059,537 | 11/1977 | Espinosa | 252/62.9 |
| 4,119,886 | 10/1978 | Jyomura et al. | 501/136 X |
| 4,889,837 | 12/1989 | Ono et al. | 501/139 |
| 4,987,107 | 1/1991 | Narumi et al. | 501/137 |
| 4,987,108 | 1/1991 | Takagi et al. | 501/138 |
| 5,084,426 | 1/1992 | Iwaya et al. | 501/136 X |
| 5,164,882 | 11/1992 | Kanai et al. | 501/136 X |
| 5,202,814 | 4/1993 | Kohno et al. | 361/321 |
| 5,272,341 | 12/1993 | Micheli et al. | 250/338.3 |
| 5,279,996 | 1/1994 | Hase et al. | 501/136 |

FOREIGN PATENT DOCUMENTS

| | | | |
|---|---|---|---|
| 0257653A2 | 8/1987 | European Pat. Off. | C04B 35/56 |
| 0380326A2 | 1/1990 | European Pat. Off. | H01G 7/06 |
| 0431671A1 | 11/1990 | European Pat. Off. | H01G 4/12 |
| 0469934A2 | 8/1991 | European Pat. Off. | G11C 11/22 |
| 0504756A1 | 3/1992 | European Pat. Off. | H01G 4/12 |
| 0503565A2 | 3/1992 | European Pat. Off. | C04B 35/46 |
| 2435712 | 2/1975 | Germany | 501/137 |
| 2449698 | 4/1975 | Germany | 501/137 |
| 3915339A1 | 11/1989 | Germany | C04B 35/00 |
| 3924803A1 | 2/1990 | Germany | C04B 35/40 |

OTHER PUBLICATIONS

G. Arlt, D. Hennings, and G. deWith, "Dielectric Properties of Fine–Grained Barium Titanate Ceramics," J. Appl. Physc., vol. 58, No. 4, 15 Aug. 1985, pp. 1619–1624.

(List continued on next page.)

*Primary Examiner*—Carolyn E. Fields
*Attorney, Agent, or Firm*—James E. Harris; Richard A. Stoltz; Richard L. Donaldson

[57] ABSTRACT

The invention described forms improved ferroelectric (or pyroelectric) layer by adding lead to an original perovskite layer having an original ferroelectric (or pyroelectric) critical grain size, then forming a layer of the lead enhanced perovskite layer having an average grain size less than the original ferroelectric (or pyroelectric) critical grain size whereby the remanent polarization (or pyroelectric figure of merit) of the layer is substantially greater than the remanent polarization (or pyroelectric figure of merit) of the original perovskite layer with an average grain size similar to the average grain size of the layer. The critical ferroelectric (or pyroelectric) grain size, as used herein, means the largest grain size such that the remanent polarization (or pyroelectric figure of merit) starts to rapidly decrease with decreasing grain sizes. Preferably, n-type lead enhanced perovskite layer is doped with one or more acceptor dopants whereby the resistivity is substantially increased. Preferably, p-type lead enhanced perovskite layer is doped with one or more donor dopants whereby the resistivity is substantially increased. Preferably, the original perovskite layer has a chemical composition $ABO_3$, where A is one or more monovalent, divalent or trivalent elements, and B is one or more pentavalent, tetravalent, trivalent or divalent elements. Structures containing an improved ferroelectric (or pyroelectric) layer include a layer of lead enhanced perovskite layer with average grain size less than the original ferroelectric (or pyroelectric) critical grain size formed on the surface of a substrate. Other structures include such a layer of lead enhanced layer interposed between two electrically conducting layers.

7 Claims, 2 Drawing Sheets

OTHER PUBLICATIONS

S. D. Bernstein, Yanina Kisler, J. M. Wahl, S. E. Bernacki, and S. R. Collins, "Effects of Stoichiometry on PZT Thin Film Capacitor Properties," Mat. Res. Soc. Symp. Proc. [Symposium on Thin Film Ferroelectrics II] (1991).

Eun–dong Kim. Yoo–Eup Hyung, and Mun–Soo Yun, "PbZrO$_3$–Doped (BaSr)Ti$_3$–Based Dielectrics for High voltage Capacitor Applications," *Ceramic Bulletin*, vol. 70, No. 11, 1991, pp. 1783–1787.

V. Chikarmane, C. Sudhama, J. Kim. J. Lee, and A. Tasch, "Comparative Sutdy of the Perovskite Phase Microstructure Evolution and electrical Properties of Lead Zirconate Titanate Thin–Film Capacitors Annealed in Oxygen and Nitrogen Ambients," *Appl. Phys. Lett.*, 59 (22), 25 Nov. 1991, pp. 2850–2852.

R. Jones, P. Maniar, J. Olowolafe, A. Campbell, and C. Mogab, "Electrical Characteristics of Paraelectric Lead Lanthanum Zirconium Titanate Thin films for dynamic Random Access Memory Applications," *Appl. Phys. Lett.*, 60(8), 24 Feb. 1992, pp. 1022–1024.

J. Scott, C. Araujo, B. Melnick, L. McMillan, R. Zuleeg, "Quantitative Measurement of Space–Charge Effects in Lead Zirconate–Titanate Memories," *J. Appl. Phys.*, 70 (1), 1 Jul. 1991, pp. 382–388.

R. Pinizzotto, E. Jacobs, H. Yang, S. Summerfelt, and B. Gnade, "Cross–Sectional TEM Studies of Barium Strontium Titanate Deposited on Silicon by Pulsed Lasar Ablation," Center for Materials Characterization, University of North Texas, Mat. Res. Soc. Pymp Proc., (1991).

D. McClure and J. Crowe, "Characterization of Amorphous Barium Titanate Films Prepared by rf Sputtering," *J. Vac. Sci. Technol.*, 16(2), Mar./Apr. 1979, pp. 311–313.

T. Sakuma, S. Yamamichi, S. Matsubara, H. Yamaguchi, and Y. Miyasaka, "Barrier Layers for REalization of High Capacitance Density in SrTiO$_3$ Thin–Film Capacitor on Silicon," *Appl. Phys. Lett.*, 57 (23) 3 Dec. 1990, pp. 2431–2433.

S. Yamamichi, T. Sakuma, K. Takemura, and Y. Miyasaka, "SrTiO$_3$ Thin Film Preparation by Ion Beam Sputtering and Its Dielectric Properties," *Japn. Journal Applied Physics*, vol. 39 (1991), pp. 2193–2196.

K. Kinoshita and Akihiko Yamaji, "Grain–Size Effects on Dielectric Properties in Barium Titanate Ceramics," *J. Appl. Phys.*, vol. 47, No. 1, Jan. 1976, pp. 371–373.

K. Koyama, T. Sakuma, S. Yamamichi, H. Watanabe, H. Aoki, S. Ohya, Y. Miyasaka, and T. Kikkawa, "A Stacked Capacitor with (Ba$_x$Sr$_{1-x}$)TiO$_3$ for 256 M DRAM," *IEEE, IEDM 91*, 1991, pp. 823–826.

J. Panitz, "Radio–Frequency–Sputtered Tetragonal Barium Titanate Films on Silicon," *J. Vac. Sci. Technol.*, 16(2) Mar./Apr. 1979, pp. 315–318.

P. C. Osbond, N. Payne, N. Shorrocks, R. Whatmore, and F. Ainer, "Dielectric and Microstructural Properties of Barium Strontium Tatanate Ceramics Prepared from Citrate Precursors," *IEEE*, Ch2358, 1986, pp. 348–351.

W. Pennebaker, "RF Sputtered Strontium Titanate Films," *IBM J. Res. Develop.*, Nov. 1969, pp. 687–695.

C. V. R. Vasant Kumar, R. Pascual, and M. Sayer, "Crystallization of Sputtered Lead Zirconate Titanate Films by Rapid Termal Processing," *J. Appl. Phys.* 71(2), 15 Jan. 1992, pp. 864–874.

G. R. Love, "Energy Storage in Ceramic Dielectrics," *J. Am. Ceram. Soc.*, 73 (2) 1990, pp. 323–328.

Y. Miyasaka and S. Matsubara, "Dielectric Properties of Sputter–Deposited BaTiO$_3$–SrTiO$_3$ Thin Films," *IEEE*, 7th Int Symp. on Appl. of Ferroelectrics, (1991) pp. 121–124.

U. Syamaprasad, R. Galgali, and B. Mohanty, "A Modified Barium Titanate for Capacitors," *J. Am. Ceram. Soc.*, 70 (7) C–147 to C–148, 1987.

A. Yamaji, Y. Enomoto, K. Kinoshita, and T. Murakami, "Preparation, Characterization, and Properties of Dy–Doped Small–Grained BaTi)$_3$ Ceramics," *Journal of the American Ceramic Society*, vol. 60, No. 3–4, Mar.–Apr. 1977, pp. 97–101.

R. Wyckoff, *Crystal Structures*, Sec. Ed. vol. 2, Inorganic Compounds, Interscience Published, John Wiley & Sons, New York, 1964, pp. 359–421.

Y. Enomoto and A. Yamaji, "Preparation of Uniformly Small–Grained BaTiO$_3$, "*Cermaic Bulletin*, vol. 60, No. 5, 1981, pp. 566–570.

G. Goodman, *Ceramic Capacitor Materials*, Marcel Dekker, Inc., 270 Madison Avenue, New York, New York 10016, (1986).

F. Jona and G. Shirane, "*Ferroelectric Crystals,*" Chapter 5, The Macmillan Company, New York, 1962.

H. Wang and D. Hall, "The Effect of Dysprosium on the Microstructre and Dielectric Properties of (Ba$_{1-x}$Sr$_x$)TiO$_3$ Ceramics," *IEEE*, 1992, pp. 51–54.

K. Uchino, E. Sadanago, and T. Hirose, "Dependence of the Crystal Structure on Particle Size in Barium Titanate," *Communications fo the American Ceramic Society*, Aug. vol. 72, No. 8, 1989, pp. 1555–1558.

S. Hsu and I. Kalish, "Ferroelectrics for Silicon VLSI," *Proc. 3rd Inter. Symp. Integrated Ferroelectrics*, 475–491 (1991) pp. 572–575.

F. A. Korger, *The Cemistry of Imperfect Crystals*, Chapter 7, North–Holland Publishing Company–Amsterdam, Interscience Publishers, 1964, pp. 198–201.

B. M. Kulwicki, A. Amin, H. Beratan, and C. Hanson, "Pyroelectric Imaging." To be presented at the 1992 Int's Symposium on Applications of Ferroelectrics.

U. Kumar, S. F. Wang, S. Varanasi, and J. P. Dougherty, "Grain Size Effect on the Dielectric Properties of Strontium Barium Titanate," *IEEE*, 1992, pp. 55–58.

M. Norton, K. Cracknell, and C. Carter, "Pulsed–Lasar Deposition of Barium Titanate Thin Films," *J. Am. Ceram. Soc.*, 75 (7), 1992, pp. 19999–2002.

T. Murakami and A. Yamaji, "Di–Doped BaTiO$_3$ Ceramics for High Voltage Capacitor Use," *Ceramic Bulletin*, vol. 55, No. 6, 1976, pp. 572–575.

T. Nozawa, J. Kato, T. Murakami, and A. Yamaji, "Stability of BaTiO$_3$ Ceramics Doped by Dy for High–Voltage Capacitor Use," *IEEE Trans. on Parts, Hybrids and Packaging*, vol. PhP–13, No. 2, Jun. 1977, p. 174.

LEAD SUBSTITUTED PEROVSKITES FOR THIN-FILM PYROELECTRIC DEVICES

CROSS-REFERENCE TO RELATED APPLICATIONS

The following related application is related to the instant application: Donor-Doped Perovskites for Thin-film Ferroelectric and Pyroelectric Devices, Ser. No. 07/951,596, filed Sep. 28, 1992 by Summerfelt et al, now abandoned.

FIELD OF THE INVENTION

This invention generally relates to the fabrication of thin film ferroelectric materials such as those used in non-volatile memory devices.

BACKGROUND OF THE INVENTION

Without limiting the scope of the invention, its background is described in connection with applications of thin-film ferroelectric and pyroelectric materials.

The class of materials known as the perovskites exhibit several properties which make them useful in the microelectronics industry. Among these properties is a dielectric constant which can be several orders of magnitude greater than that of conventional insulators used in integrated circuits (e.g. $SiO_2$ and $Si_3N_4$). This high dielectric constant can allow fabrication of very small capacitors which store charge in conventional DRAMs (dynamic random access memories), thereby increasing the density of memory cells.

Related to the dielectric constant is the pyroelectric figure of merit (pyroelectric FOM). The pyroelectric FOM is proportional to the ratio between the pyroelectric coefficient and dielectric constant. The pyroelectric coefficient is a function of the dielectric constant and the spontaneous polarization. Many perovskites exhibit a very large pyroelectric FOM, and if sufficiently large this pyroelectric property makes possible devices which are very sensitive to changes in temperature, including temperature changes caused by impinging electromagnetic radiation. Arrays of such pyroelectric detectors are now being fabricated which can image an infrared scene. These detectors do not require cryogenic cooling and are therefore economically feasible for consumer applications.

The ferroelectric properties of perovskite materials are also useful in the microelectronics industry. Among those properties is the remanent polarization. The direction of this polarization may be switched by the application of an electric field to the material. The direction of this polarization may then be sensed electronically. The remanent polarization of these materials suggests that FRAMs (ferroelectric random access memories) could be constructed which would be non-volatile, i.e. the state (logic one or zero) of each memory element would be retained even if power is removed. Such devices, depending on the configuration, could in addition exhibit faster read/write cycles than conventional DRAMs.

SUMMARY OF THE INVENTION

This invention is a method of forming thin-film perovskite structures which exhibit useful ferroelectric and pyroelectric properties. The perovskite materials are (1) any material exhibiting the well known perovskite crystal structure, typified by $CaTiO_3$; and (2) compounds with structures which can be derived from the ideal cubic perovskite structure by way of small lattice distortions or omission of some atoms.

Many perovskites have the chemical formula $ABO_3$, where A is one or more monovalent, divalent or trivalent elements and B is one or more pentavalent, tetravalent, trivalent or divalent elements.

To be useful in the fabrication of integrated circuit FRAMs, perovskite materials must exhibit large remanent polarization and small coercive voltage. To be useful in the fabrication of thin-film pyroelectric devices, perovskite materials must exhibit a large pyroelectric FOM. These properties should be present in thin-films of these materials.

It has been discovered that the ferroelectric and pyroelectric properties of perovskite materials generally decrease as the grain size of the material is decreased. Bulk ceramic forms of perovskites generally have grain sizes on the order of 0.5–100 micrometers ($\mu m$), whereas typical thin-films have grain sizes of 0.02–0.5 $\mu m$. As will be discussed further, the useful properties are essentially absent for grain sizes below a critical grain size which is unique for each material and property.

Much of the past research in this area has endeavored to preserve the ferroelectric and pyroelectric properties of perovskites in thin film form. Larger grains (with often better properties) can be formed by keeping the temperature of the substrate onto which the perovskite film is deposited at a high temperature, because higher deposition temperatures usually produce larger grain sizes in the deposited film. Higher substrate temperatures, however, may cause damage to existing devices and structures already formed on the substrate. Generally, temperatures should be kept as low as possible. In addition, the grain size generally is no larger than the film thickness (preferably to less than 1/10th of film thickness). Current methods of depositing thin film perovskites with good ferroelectric and pyroelectric properties are thus limited by the film thickness and the potential damage caused by elevating the substrate to high temperatures.

Generally, this invention overcomes the tradeoffs inherent in prior art techniques by changing the composition of the material in a way that decreases the grain size at which ferroelectric and/or pyroelectric properties abate. An improved ferroelectric material can be formed by adding lead to an original perovskite material having an original ferroelectric critical grain size, then forming a layer of the lead enhanced perovskite material having an average grain size less than the original ferroelectric critical grain size whereby the remanent polarization of the layer is substantially greater than the reinanent polarization of the original perovskite material with an average grain size similar to the average grain size of the layer. The ferroelectric critical grain size, as used herein, means the largest grain size such that the remanent polarization starts to rapidly decrease with decreasing grain sizes (e.g. to a value of ½ the peak). Preferably, an n-type lead enhanced perovskite material is doped with one or more acceptor dopants whereby the resistivity is substantially increased. Preferably, a p-type lead enhanced perovskite material is doped with one or more donor dopants whereby the resistivity is substantially increased. Preferably, the original perovskite material has a chemical composition $ABO_3$, where A is one or more monovalent, divalent or trivalent elements (but, of course contains no lead), and B is one or more pentavalent, tetravalent, trivalent or divalent elements (but, again of course contains no lead).

The pyroelectric properties (i.e. pyroelectric FOM) of thin film perovskite materials can be enhanced by adding lead. Thus a layer of an improved pyroelectric material can be made by adding lead to an "original" perovskite material (which would have had a certain original pyroelectric critical grain size), and the layer of the lead enhanced perovskite material can have an average grain size less than the "original" pyroelectric critical grain size whereby the pyroelectric FOM of the layer is substantially greater than the pyroelectric FOM of the "original" perovskite material would have at that same grain size. The pyroelectric critical grain size, as used herein, means the largest grain size such that the pyroelectric FOM starts to rapidly decrease with decreasing grain sizes.

Embodiments include of a layer (and a method of forming a layer, preferably of less than 10 micron thickness) of low lead-containing perovskite material having an average grain size of less than 1 micron and a composition $(A_{1-x}, Pb_x)_u$-$B_vO_3$, where A comprises one or more monovalent, divalent or trivalent elements, B comprises one or more pentavalent, tetravalent, trivalent, divalent, or monovalent elements, and $0.01<x<0.5$, $0.9<u<1.1$, and $0.9<v\ 21\ 1.1$, whereby critical grain size is reduced, and/or dielectric properties are improved and/or process temperatures are reduced compared to similar materials where x=0. Preferably, the layer of perovskite is interposed between a first conductive layer and a second conductive layer. Preferably the grain size less than 0.5 micron and the layer is formed at a temperature of less than 600 degrees C.

Preferable compositions and values for "x" include: where A principally comprises strontium, B principally comprises titanium, and x is approximately 0.35; where A principally comprises strontium, B principally comprises titanium, and x is approximately 0.1–0.4; where A principally comprises strontium, B principally comprises titanium, and x is approximately 0.3–0.4; where A principally comprises strontium, B principally comprises titanium, and x is approximately 0.3; where A principally comprises strontium, B principally comprises titanium, and x is approximately 0.2; and where A principally comprises barium and strontium, B principally comprises titanium, and x is approximately 0.1–0.4. Materials and uses include: where the perovskite layer is doped or undoped barium lead titinate and the layer is utilized as a ferroelectric; where the perovskite layer is strontium lead titanate and the layer is utilized as a pyroelectric; where the perovskite layer is doped or undoped strontium lead titanate and the layer is utilized as a pyroelectric or as layer for a high dielectric capacitor; and where the perovskite layer is barium lead titinate with limited amounts of strontium titanate and barium zirconate and the layer is utilized as a pyroelectric using the lower ferroelectric-ferroelectric phase transition of the layer and x is approximately 0.1–0.4.

Preferably, an n-type lead enhanced perovskite material is doped with one or more acceptor dopants whereby the resistivity is substantially increased. Preferably, a p-type lead enhanced perovskite material is doped with one or more donor dopants whereby the resistivity is substantially increased. Preferably, the original perovskite material has a chemical composition $ABO_3$, where A is one or more monovalent, divalent or trivalent elements, and B is one or more pentavalent, tetravalent, trivalent or divalent elements.

Structures containing these improved ferroelectric and pyroelectric materials can include a layer of lead enhanced perovskite material with average grain size less than the original ferroelectric or pyroelectric critical grain size formed on the surface of a substrate. Other structures include such a layer of lead enhanced material interposed between two electrically conducting layers.

The materials presented may find use in many structures used in semiconductor circuitry, such as capacitors, transistors, non-volatile memory cells, pixels for electro-magnetic radiation detecting arrays, and other electrooptic applications. Devices which exploit the piezoelectric properties of many of these materials will benefit from this invention.

The advantages of this invention include substantially increased remanent polarization for perovskite materials formed with grain sizes typically found in thin films. This invention also serves to preserve the pyroelectric FOM in thin films of perovskite materials. In addition, the resistivity is generally increased by the methods presented.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings.

In the drawings.

DETAILED DESCRIPTION OF THE PREFERRED EMBODIMENT(S)

Figure 1:
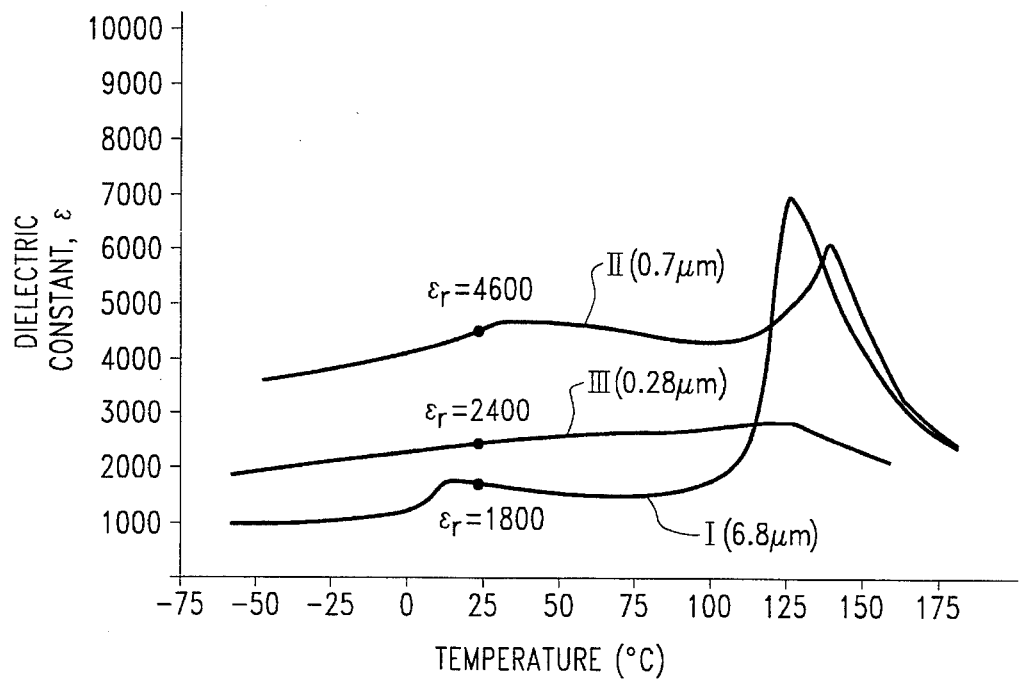
FIG. 1 is a graph showing the variation of dielectric constant versus temperature for undoped barium titanate of various grain sizes.

The useful ferroelectric and pyroelectric properties of a perovskite material generally decrease as the grain size of the material is decreased. As shown in FIG. 1, the dielectric constant of undoped barium titanate (BT) varies with temperature and grain size. For a grain size of 6.8 μm, the dielectric constant varies rapidly near the Curie temperature (approximately 130° C.), but is less variable at other temperatures. As the grain size is decreased to 0.7 μm, the peak becomes less pronounced, the dielectric constant below the Curie temperature increases and varies less with temperature. At still smaller grain sizes, the dielectric constant decreases for all temperatures and is essentially constant with respect to temperature.

Figure 2:
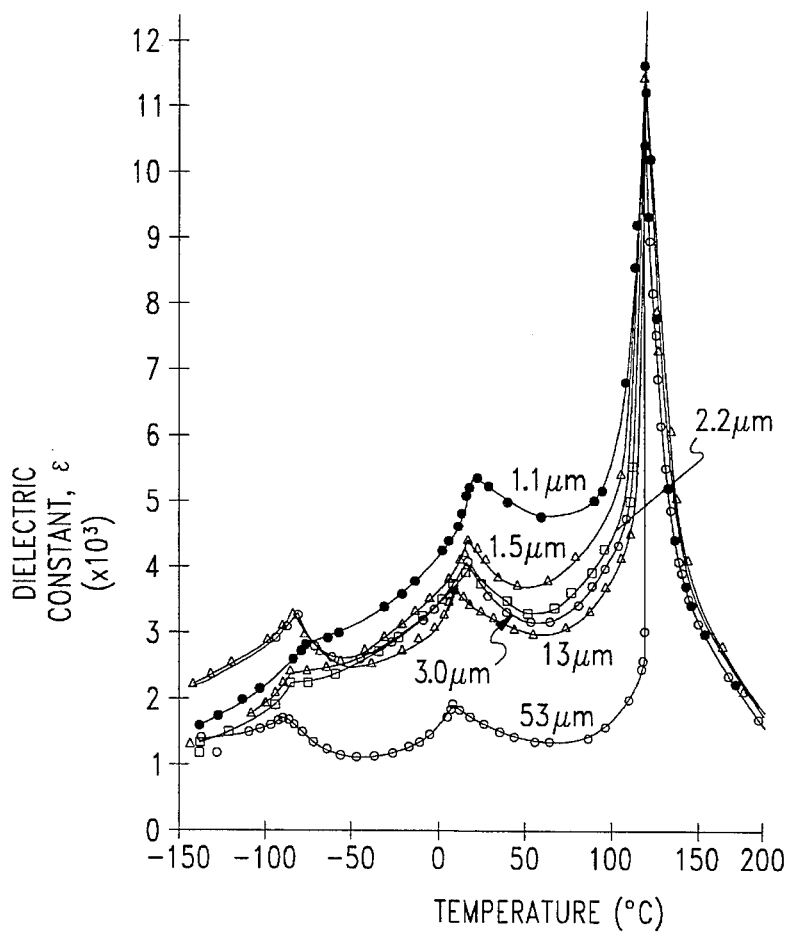
FIG. 2 is a graph showing the variation of dielectric constant versus temperature for undoped barium titanate of various grain sizes.

Referring to FIG. 2, the same trend can be seen. At large grain sizes (i.e. 53 μm), the dielectric constant has a pronounced peak at the Curie temperature. As the grain size decreases, the dielectric constant below the Curie temperature increases and the peak is less pronounced.

Figure 3:
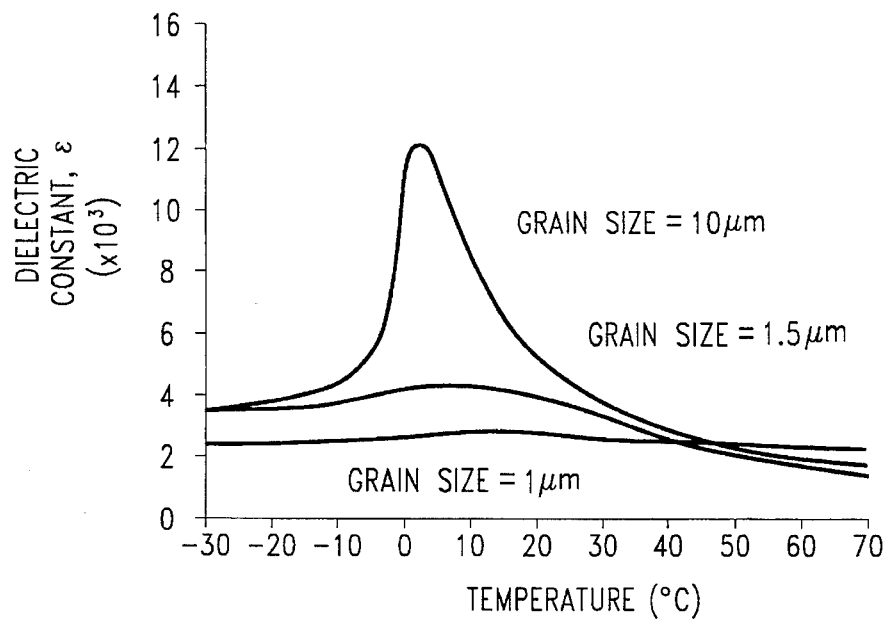
FIG. 3 is a graph showing the variation of dielectric constant versus temperature for undoped barium strontium titan ate of various grain sizes.

Referring to FIG. 3, the same trend is illustrated for barium strontium titanate (BST). At a 10 μm grain size, the dielectric constant varies rapidly with temperature, but at smaller grains sizes the peak is less pronounced.

Generally, when the rate of change of the dielectric constant with temperature is large, the pyroelectric FOM is also large. As these figures show, the rate of change of the dielectric constant decreases below some grain size, i.e. the slope of the curve becomes smaller as the grain size is decreased below some value. That value for barium titanate is approximately 6.8 μm according to the data represented by FIG. 1. As FIG. 3 illustrates, that value for barium strontium titanate is approximately 10 μm.

As these figures illustrate, the pyroelectric FOM of pyroelectric perovskite materials decreases rapidly below some grain size. Again, the pyroelectric critical grain size (PCGS), as used herein, means the largest grain size such that the pyroelectric FOM starts to rapidly decrease with decreasing grain sizes (e.g. to a value of ½ the peak). The typical grain size present in most thin-film perovskites is generally much smaller than the PCGS, causing the pyroelectric properties of thin films to be small or nonexistent. The grain size of a thin film perovskite must be larger than the PCGS in order for the film to possess useful pyroelectric properties. A method to decrease the PCGS below typical thin film grain sizes is desirable.

The useful ferroelectric properties of perovskites also decrease for decreasing grain sizes. For example, the remanent polarization exhibited by barium zirconate titan ate is 18 μC/cm$^2$ for grain sizes larger than 100 82 m. For grain sizes in the range of 30 to 50 μm, the remanent polarization has been measured at 6 μC/cm$^2$. For still smaller grain sizes (e.g. 1 μm), the remanent polarization rapidly decreases until it is essentially gone.

As is illustrated by this example, the remanent polarization of ferroelectric perovskite materials decreases rapidly below some grain size. The typical grain size present in most thin-films is generally much smaller than the FCGS, thus the ferroelectric properties of such perovskites thin films would be small or nonexistent, and as such perovskites have not been used in thin films. The grain size of a thin film perovskite must be larger than the FCGS in order for the film to possess useful ferroelectric properties. Thus a method to decrease the FCGS below typical thin film grain sizes is desirable.

It has been found that lead generally decreases the pyroelectric critical grain size and the ferroelectric critical grain size of perovskite materials. This effect is not taught by the prior art and its mechanism and explanation are uncertain. Lead may be added to a perovskite material which, as normally previously used, contained essentially no lead. Alternately, lead may be added to a perovskite material which initially contains some lead. In either case, the critical grains sizes (FCGS and PCGS) of the lead enhanced materials are less than the critical grain sizes of the original material.

It has also been found that acceptor dopants increase the resistivity of n-type lead enhanced perovskite materials. Therefore, another aspect of this invention is acceptor doping of n-type lead enhanced ferroelectric and pyroelectric perovskite materials. Generally, an element or ion is an acceptor dopant if (1) it replaces an atom in the crystal lattice and has a lesser number of valence electrons than the atom it replaces or (2) it exists interstitially and its outer electron shell is more than half full. Intermediate cases are uncertain and may be determined empirically. For example, some elements behave as acceptor dopants in (1) when their valence is the same as the atom replaced. Likewise, in (2) some elements behave as acceptor dopants when their valence shell is exactly half full.

It has also been found that donor dopants increase the resistivity of p-type lead enhanced perovskite materials. Therefore, another aspect of this invention is donor doping of p-type lead enhanced ferroelectric and pyroelectric perovskite materials. Generally, an element or ion is a donor dopant if (1) it replaces an atom in the crystal lattice and has a greater number of valence electrons than the atom it replaces or (2) it exists interstitially and its outer electron shell is less than half full. Intermediate cases are uncertain and may be determined empirically. For example, some elements behave as donor dopants in (1) when their valence is the same as the atom replaced. Likewise, in (2) some elements behave as donor dopants when their valence shell is exactly half full.

A dopant is a species which is intentionally introduced into an intrinsic material in order to produce some effect. Unintentional impurities which exist in concentrations below approximately 0.1 mole percent are not generally considered dopants. Accordingly, in the context of this invention, an intrinsic perovskite material is a perovskite material in which impurities which behave as acceptor dopants, if present, exist at concentrations below approximately 0.1 mole percent.

In a preferred embodiment of this invention, material with the nominal composition

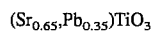

$(Sr_{0.65},Pb_{0.35})TiO_3$ is prepared by combining constituents in a solution, then calcining the solution in bulk. The bulk ceramic is then ground, pressed, and sintered to produce a ceramic with density at least 95% of theoretical density.

To measure the properties of the preferred embodiment material, the ceramic is mechanically polished and thinned to 250 μm thickness. Metallization is applied to form test capacitors.

The average grain size of the material produced was 0.8 μm as measured by the line intercept method. The peak dielectric constant (the dielectric constant at the Curie temperature) was greater than 10,000, and varied rapidly with respect to temperature. This behavior indicates that the pyroelectric critical grain size of this material is less than 0.8 μm.

The Curie temperature of $(Sr_{0.35},Pb_{0.35})TiO_3$ is ~300K while the curie temperature of pure $SrTiO_3$ is ~7K below which the $SrTiO_3$ becomes antiferroelectric and not ferroelectric. The ferroelectric critical grain size of $SrTiO_3$ is therefore dependent on the measurement temperature and does not exist at room temperature since the $SrTiO_3$ is never ferroelectric. It is therefore very difficult to compare the FCGS of $(Sr_{0.65},Pb_{0.35})TiO_3$ with $SrTiO_3$. Fortunately, it is fairly simple to compare the properties of $(Sr_{065},Pb_{0.35})TiO_3$ (SPT) with $(Ba_{0.70},Sr_{0.30})TiO_3$ (BST). Both of these compounds are ferroelectric with a curie temperature near room temperature. The CGS of BST is ~10 μm while that of SPT is less than 0.8 μm. It is very difficult to compare the properties of compounds with different curie temperature because the ferroelectric and pyroelectric properties change so drastically near the Curie temperature. For example, the spontaneous polarization decreases and becomes zero as the temperature approaches and then reaches the Curie temperature. BST and the SPT are just a subset of the compounds $(Sr_{1-x-y},Ba_x,Pb_y)TiO_3$ (SBPT). Since $(Sr_{0.65},Pb_{0.35})TiO_3$ and $(Ba_{0.70},Sr_{0.30})TiO_3$ have the same curie temperature the improvement in the CGS of SPT compared to BST must be due to the substitution of the Pb for Ba and Sr. As mentioned previously, the explanation for why the substitution of Pb on the A site improve the ferroelectric and pyroelectric properties at small grain sizes is unclear.

Figure 4:
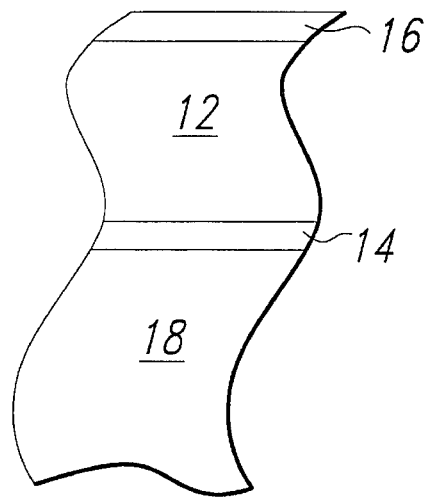
FIG. 4 shows the cross-section of a lead-enhanced perovskite between conductive layers.

A structure using such a perovskite is shown in FIG. 4. This embodiment shows of a layer of low lead-containing perovskite material 12 having an average grain size of less than 1 micron and a composition $(A_{1-x},Pb_x)_uB_vO_3$, where A comprises one or more monovalent, divalent or trivalent elements, B comprises one or more pentavalent, tetravalent, trivalent, divalent, or monovalent elements, and $0.01<x<0.5$, $0.9<u<1.1$, and $0.9<v<1.1$, whereby critical grain size is reduced, and/or dielectric properties are improved and/or process temperatures are reduced compared to similar materials where $x=0$. Preferably, the layer of perovskite 12 is interposed between a first conductive layer 14 and a second conductive layer 16. Perovskite 12 is shown on the first conductive layer 14 which is in turn on a substrate 18.

Figure 5:
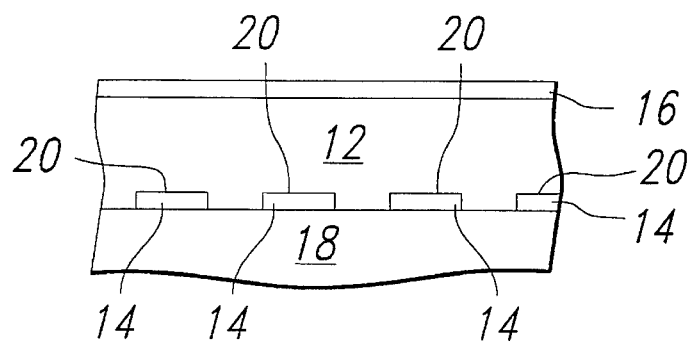
FIG. 5 shows a cross-section of an array of pyroelectric detectors having a layer of lead-enhanced perovskite.

A cross-section of a microelectronic device comprising an array of pyroelectric detectors is shown in FIG. 5. In this embodiment, first conductive layer 14 is patterned to form an array of conductive elements 20 as is common in the art. A Layer of low-lead containing perovskite material 12 and a second conductive layer 16 are formed over layer 14. Each pyroelectric detector in the array comprises one of the conductive elements 20 and an overlying portion of layers 14 and 16.

A preferred embodiment has been described in detail hereinabove. It is to be understood that the scope of the invention also comprehends embodiments different from those described, yet within the scope of the claims. For example, many perovskite materials also exhibit piezoelectric properties which make them useful in miniature mechanical devices, sensors, and standing acoustic wave (SAW) devices. The effects and advantages of donor doping of these materials apply equally well to piezoelectric applications.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microelectric device comprising an array of pyroelectric detectors integrated on a semiconductor substrate, each of said detectors comprising:

a first conductive layer deposited on said substrate;

a pyroelectric thin film deposited on said first conductive layer, said pyroelectric thin film having a thickness of less than 10 microns and an average grain size of less than 1 micron, said pyroelectric thin film having a composition $(A_{1-x}Pb_x)_u Ti_v O_3$, wherein A is selected from the group consisting of barium, strontium, and combinations thereof, $0.01<x<0.5$, $0.9<u<1.1$, and $0.9<v<1.1$; and a second conductive layer deposited over said pyroelectric thin film;

whereby pyroelectric figure of merit is increased as compared to said device wherein $x=0$.

2. The device of claim 1, wherein said average grain size is less than 0.5 microns.

3. The device of claim 1, wherein $0.05<x<0.1$.

4. The device of claim 1, wherein A comprises barium and strontium.

5. The device of claim 1, wherein A comprises strontium.

6. The device of claim 5, wherein x is about 0.35.

7. The device of claim 3, wherein A further comprises at least 0.1 mole percent of a dopant having three valence electrons, whereby the resistivity of said thin film is increased by addition of said dopant.

* * * * *